US012598919B2

(12) United States Patent　　　　(10) Patent No.:　US 12,598,919 B2

Motoyama et al.　　　　　　　　　　(45) Date of Patent:　　　　Apr. 7, 2026

(54) MRAM DEVICE WITH HAMMERHEAD PROFILE

(71) Applicant: INTERNATIONAL BUSINESS MACHINES CORPORATION, Armonk, NY (US)

(72) Inventors: Koichi Motoyama, Clifton Park, NY (US); Oscar van der Straten, Guilderland Center, NY (US); Jennifer Church, Albany, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 684 days.

(21) Appl. No.: 18/063,710

(22) Filed: Dec. 9, 2022

(65) Prior Publication Data

US 2024/0196758 A1　　Jun. 13, 2024

(51) Int. Cl.
*H10N 50/80*　　　(2023.01)
*G11C 11/16*　　　(2006.01)
*H10B 61/00*　　　(2023.01)
*H10N 50/01*　　　(2023.01)

(52) U.S. Cl.
CPC ........... *H10N 50/80* (2023.02); *G11C 11/161* (2013.01); *H10B 61/00* (2023.02); *H10N 50/01* (2023.02)

(58) Field of Classification Search
CPC ........ H10N 50/80; H10N 50/01; H10N 50/10; G11C 11/161; H10B 61/00
See application file for complete search history.

(56) References Cited

U.S. PATENT DOCUMENTS

| | | | |
|---|---|---|---|
| 7,695,897 | B2 | 4/2010 | Bucchignano |
| 8,048,685 | B2 | 11/2011 | Boivin |
| 9,362,336 | B2 | 6/2016 | Lu |
| 9,553,257 | B1 | 1/2017 | Annunziata |
| 10,770,652 | B2 | 9/2020 | Marchack |
| 10,840,441 | B2 | 11/2020 | Annunziata |

(Continued)

FOREIGN PATENT DOCUMENTS

| | | |
|---|---|---|
| CN | 101960530 A | 1/2011 |
| CN | 101965615 A | 2/2011 |

(Continued)

*Primary Examiner* — Shih Tsun A Chou

(74) *Attorney, Agent, or Firm* — Teddi E. Maranzano

(57) ABSTRACT

A magnetic tunnel junction (MTJ) stack with a hammerhead profile, including vertically aligned layers of a top electrode, a free layer, a tunneling barrier, a reference layer and a bottom electrode, where the bottom electrode and the reference layer each include a first width, and the top electrode, the free layer and the tunneling barrier, each include a second width greater than the first width. Forming vertically aligned layers of a bottom electrode and a reference layer on the bottom electrode, of a magnetic tunnel junction (MTJ), where the bottom electrode, the reference layer and the hard mask, each include a first width, and separately forming vertically aligned layers of a tunneling barrier, a free layer and a top electrode on the free layer, where the tunneling barrier, the free layer and the top electrode each include a second width, where the second width is greater than the first width.

13 Claims, 19 Drawing Sheets

(56)     References Cited

U.S. PATENT DOCUMENTS

| 2010/0193888 A1* | 8/2010 | Gu | H10N 50/01 |
| | | | 257/E29.323 |
| 2014/0061827 A1 | 3/2014 | Huang | |
| 2016/0308119 A1 | 10/2016 | Hsu | |
| 2021/0066581 A1* | 3/2021 | Doris | H10N 50/01 |
| 2021/0351348 A1 | 11/2021 | Hsu | |

FOREIGN PATENT DOCUMENTS

| CN | 114497355 A | 5/2022 |
| TW | 201207851 A | 2/2012 |
| TW | 201705563 A | 2/2017 |

* cited by examiner

MRAM DEVICE WITH HAMMERHEAD PROFILE

BACKGROUND

The present invention relates, generally, to the field of semiconductor manufacturing, and more particularly to fabricating a magnetic tunnel junction device with a hammerhead shaped profile.

Magneto resistive random-access memory ("MRAM") devices are used as non-volatile computer memory. MRAM data is stored by magnetic storage elements. The elements are formed from two ferromagnetic layers, each of which can hold a magnetic field, separated by a spin conductor layer. One of the two layers is a reference magnet, or a reference layer, set to a particular polarity, while the remaining layer's field can be changed to match that of an external field to store memory and is termed the "free magnet" or "free-layer". This configuration is known as the magnetic tunnel junction (MTJ) and is the simplest structure for a MRAM bit of memory.

SUMMARY

According to an embodiment of the present invention, a semiconductor device is provided. The semiconductor device including a magnetic tunnel junction (MTJ) stack, where a cross section of the MTJ stack includes a hammerhead profile. The semiconductor device where the MTJ stack includes vertically aligned layers of a top electrode, a free layer, a tunneling barrier, a reference layer and a bottom electrode. The semiconductor device further including the bottom electrode and the reference layer each include a first width. The semiconductor device further including the top electrode, the free layer and the tunneling barrier, each include a second width, where the second width is greater than the first width. The semiconductor device further including a first liner along vertical side surfaces of the bottom electrode, the reference layer and the tunneling barrier, where the first liner is not along vertical side surfaces of the free layer nor the top electrode. The semiconductor device further including a second liner along vertical side surfaces of the tunneling barrier, the free layer and the top electrode, where the second liner is not in contact with the first liner. The semiconductor device further including the tunneling barrier and the free layer each include a first horizontal lower surface and a second horizontal lower surface, where the first horizontal lower surface is not adjacent to the second horizontal lower surface.

According to an embodiment of the present invention, a semiconductor device is provided. The semiconductor device including a magnetic tunnel junction (MTJ) stack, where a cross section of the MTJ stack comprises a hammerhead profile, where the MTJ stack comprises vertically aligned layers of a top electrode, a free layer, a tunneling barrier, a reference layer and a bottom electrode, where the bottom electrode and the reference layer each include a first width, and the top electrode, the free layer and the tunneling barrier, each include a second width, where the second width is greater than the first width. The semiconductor device further including a first liner along vertical side surfaces of the bottom electrode, the reference layer and the tunneling barrier, where the first liner is not along vertical side surfaces of the free layer nor the top electrode. The semiconductor device further including a second liner along vertical side surfaces of the tunneling barrier, the free layer and the top electrode, where the second liner is not in contact with the first liner. The semiconductor device further including the tunneling barrier and the free layer each include a first horizontal lower surface and a second horizontal lower surface, where the first horizontal lower surface is not adjacent to the second horizontal lower surface.

According to an embodiment of the present invention, a method is provided. The method including forming vertically aligned layers of a bottom electrode and a reference layer on the bottom electrode, of a magnetic tunnel junction (MTJ) stack in a first dielectric, where the bottom electrode, the reference layer and the hard mask, each include a first width, and separately forming vertically aligned layers of a tunneling barrier on the reference layer, a free layer on the tunneling barrier and a top electrode on the free layer, where the tunneling barrier, the free layer and the top electrode each include a second width, where the second width is greater than the first width. The method further including forming a first liner along vertical side surfaces of the bottom electrode, the reference layer and the tunneling barrier, where the first liner is not along vertical side surfaces of the free layer nor the top electrode. The method further including forming a second liner along vertical side surfaces of the tunneling barrier, the free layer and the top electrode, where the second liner is not in contact with the first liner. The method, where the tunneling barrier and the free layer each include a first horizontal lower surface and a second horizontal lower surface, wherein the first horizontal lower surface is not adjacent to the second horizontal lower surface. The method further including forming a low-k dielectric surrounding the vertically aligned layers of the bottom electrode and the reference layer.

BRIEF DESCRIPTION OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
FIG. 1 illustrates a cross-sectional view of a multi-state memory cell, according to an exemplary embodiment.
Figure 1:
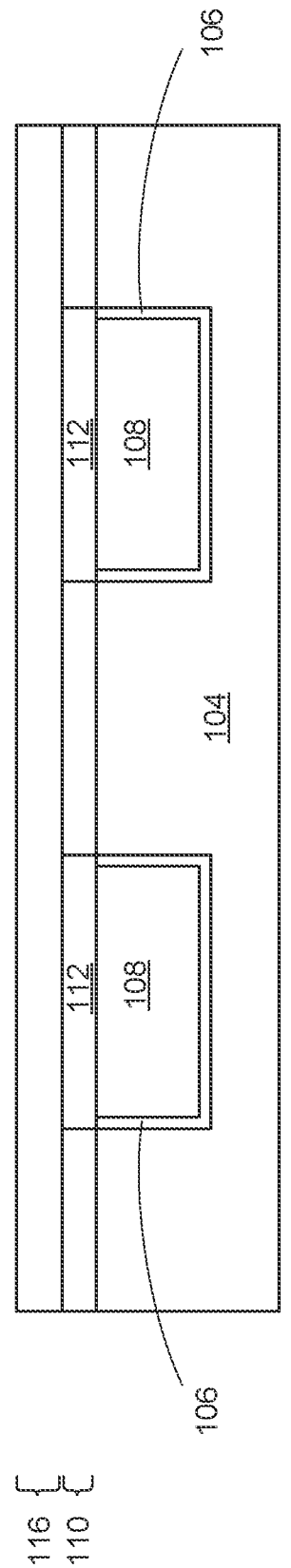

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiment set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

As stated above, magneto resistive random-access memory (hereinafter "MRAM") devices are a non-volatile computer memory technology. MRAM data is stored by magnetic storage elements. The elements are formed from two ferromagnetic layers, each of which can hold a magnetic field, separated by a spin conductor layer. One of the two layers is a reference magnet, or a reference layer, set to a particular polarity, while the remaining layer's field can be changed to match that of an external field to store memory and is termed the "free magnet" or "free-layer". The magnetic reference layer may be referred to as a reference layer, and the remaining layer may be referred to as a free layer. This configuration is known as the magnetic tunnel junction (hereinafter "MTJ") and is the simplest structure for a MRAM bit of memory.

A memory device is built from a grid of such memory cells or bits. In some configurations of MRAM, such as the type further discussed herein, the magnetization of the magnetic reference layer is fixed in one direction (up or down), and the direction of the magnetic free layer can be switched by external forces, such as an external magnetic field or a spin-transfer torque generating charge current. A smaller current (of either polarity) can be used to read resistance of the device, which depends on relative orientations of the magnetizations of the magnetic free layer and the magnetic reference layer. The resistance is typically higher which the magnetizations are anti-parallel and lower when they are parallel, though this can be reversed, depending on materials used in fabrication of the MRAM.

The MRAM stack layers may be conformally formed using known techniques. In formation of the MTJ stacks layers, the reference layer is formed on a dielectric and a bottom electrode. The tunneling barrier layer is formed on the reference layer. In an embodiment, the tunneling barrier layer is a barrier, such as a thin insulating layer or electric potential, between two electrically conducting materials. Electrons (or quasiparticles) pass through the tunneling barrier layer by the process of quantum tunneling. In certain embodiments, the tunneling barrier layer includes at least one sublayer composed of magnesium oxide (MgO). It should be appreciated that materials other than MgO can be used to form the tunneling barrier layer. The free layer is a magnetic free layer that is adjacent to tunneling barrier layer and opposite the reference layer. The free layer has a magnetic moment or magnetization that can be flipped. It should also be appreciated that the MTJ stack layers may include additional layers, omit certain layers, and each of the layers may include any number of sublayers. Moreover, the composition of layers and/or sublayers may be different between the different MRAM stacks.

For high performance MRAM devices based on perpendicular magnetic tunnel junction (MTJ) structures, well-defined interfaces and interface control are essential. MTJ structures typically include a cobalt (Co) based synthetic anti-ferromagnet (SAF), a CoFeB-based reference layer, a MgO-based tunnel barrier, a CoFeB-based free layer, and cap layers containing e.g. tantalum (Ta) and/or ruthenium (Ru). Embedded MTJ structures are usually formed by subtractive patterning of blanket MTJ stacks into pillars between two metal levels.

Reactive ion etch (RIE) and ion beam etch (IBE) processing of the blanket MTJ stacks into pillars presents a major challenge, as it typically leads to shorts due to re-sputtering of thick bottom metal layers onto sidewalls of the MTJ stacks. There is a need for embedded MTJ structures formed by methods with a reduced risk of shorts due to metal re-sputtering.

In this invention, an MTJ structure may be formed with a hammerhead side profile. The MTJ structure may have vertically aligned layers of a bottom electrode, and a reference layer above the bottom electrode, with both the bottom electrode and the reference layer having a first diameter, which are similar to each other. The bottom electrode and the reference layer are formed by a subtractive scheme.

Above the reference layer may be vertically aligned layers of a tunneling barrier, a free layer on the tunneling barrier, and a top electrode on the free layer. The tunneling barrier, the free layer and the top electrode layers may each have a second diameter, which are similar to each other. The second diameter may be greater than the first diameter. Additionally, the tunneling barrier may have a 'stepped' lower horizontal surface, which includes a first lower horizontal surface directly on an upper horizontal surface of the reference layer, and a vertical side surface along a vertical side surface of the free layer, and a second lower horizontal surface below the free layer, extending out wider than the first lower horizontal surface. The tunneling barrier may surround a portion of the free layer. The free layer may also have a 'stepped' lower horizontal surface, which includes a third lower horizontal surface directly on an upper horizontal surface of the tunneling barrier, and a vertical side surface along a vertical side surface of the tunneling barrier, and a fourth lower horizontal surface below the top electrode, extending out wider than the third lower horizontal surface. A portion of the free layer may vertically surround a portion of the top electrode.

The top electrode may have a greater thickness in a center portion of the MTJ structure and a lower thickness at an outer portion of the MTJ structure. The tunneling barrier, the free layer and the top electrode are formed by a damascene scheme. This means that a cavity is formed and the tunneling barrier, the free layer and the top electrode are deposited into the cavity. The tunneling barrier, the free layer and the top electrode are subsequently patterned.

This invention prevents metal re-sputtering from the bottom electrode and the reference layer during the tunneling barrier and free layer formation.

An MRAM pillar having a hammerhead helps to reduce metal re-sputtering from the bottom electrode and the reference layer during the tunneling barrier and free layer formation. This helps to extend scalability of MRAM device memory elements due to reduced sputtering between MRAM pillars and improved embedded MRAM performance due to reduced top contact shorts.

Referring now to FIG. 1, a semiconductor structure 100 (hereinafter "structure") at an intermediate stage of fabrication is shown according to an exemplary embodiment. FIG. 1 is a cross-sectional view of the structure 100. The structure 100 may be formed or provided. The structure 100 may include a cell 101 and a cell 103. The cells 101, 103, each includes, for example, an inter-layer dielectric (hereinafter "ILD") 104, a liner 106, a lower metal wire 108, an inter-layer dielectric (hereinafter "ILD") 110, a metal cap 112 and a bottom electrode 116.

The structure 100 may include several back end of line ("BEOL") layers. In general, the back end of line (BEOL) is the second portion of integrated circuit fabrication where the individual devices (transistors, capacitors, resistors, etc.) are interconnected with wiring on the wafer.

The ILD 104 may be formed by depositing or growing a dielectric material on the BEOL layers, followed by a chemical mechanical polishing (CMP) or etch steps. The ILD 104 may be deposited using typical deposition techniques, for example, atomic layer deposition (ALD), molecular layer deposition (MLD), chemical vapor deposition (CVD), physical vapor deposition (PVD), high density plasma (HDP) deposition, and spin on techniques, followed by a planarization process, such as CMP, or any suitable etch process. In an embodiment, the ILD 104 may include one or more layers. In an embodiment, the ILD 104 may include any dielectric material such as silicon oxide (SiOx), silicon nitride (SiNx), silicon boron carbonitride (SiBCN), NBLoK, a low-k dielectric material (with k<4.0), including but not limited to, silicon oxide, spin-on-glass, a flowable oxide, a high-density plasma oxide, borophosphosilicate glass (BPSG), or any combination thereof or any other suitable dielectric material.

The lower metal wire 108 may be formed by first patterning two or more trenches (not shown) into the ILD 104, lining the two or more trenches with the liner 106, and filling the two or more trenches.

The liner 106 separates the conductive interconnect material of the lower metal wire 108 from the ILD 104. The liner 106 may be composed of, for example, tantalum nitride (TaN), tantalum (Ta), titanium (Ti), titanium nitride (TiN), or a combination thereof. The liner 106 may be deposited utilizing a conventional deposition process such as, for example, CVD, plasma enhanced chemical vapor deposition (PECVD), PVD or ALD. The liner 106 may be 5 nm thick, although a thickness less than or greater than 5 nm may be acceptable. The liner 106 surrounds a lower horizontal surface and a vertical side surface of the lower metal wire 108.

In an embodiment, the lower metal wire 108 is formed from a conductive material layer which is blanket deposited on top of the structure 100, and directly on a top surface of the liner 106, filling the two or more trenches (not shown). The conductive material layer may include materials such as, for example copper (Cu), ruthenium (Ru), cobalt (Co), tungsten (W). The conductive material can be formed by for example, chemical vapor deposition (CVD), physical vapor deposition (PVD), and atomic layer deposition (ALD) or a combination thereof. The lower metal wire 108 is formed by damascene, or patterned from the conductive material layer, using known patterning and etching techniques. There may be any number of openings in the ILD 104, each filled with the liner 106 and the lower metal wire 108, on the structure 100.

A planarization process, such as, for example, chemical mechanical polishing (CMP), may be done to remove excess material from a top surface of the structure 100 such that upper horizontal surfaces of the lower metal wire 108, the liner 106 and the ILD 104 are coplanar.

In an embodiment, the lower metal wire 108 may have a thickness ranging from about 10 nm to about 100 nm, although a thickness less than 10 nm and greater than 100 nm may be acceptable.

The ILD 110 may be formed as described for the ILD 104, directly on a top surface of the liner 106, the lower metal wire 108 and the ILD 104. The metal cap 112 may be formed by first patterning two or more second trenches (not shown) into the ILD 110 vertically aligned above the lower metal wire 108 and the liner 106, and filling the two or more second trenches. The ILD 110 is unlikely to contain voids as the ILD 110 is blanket deposited on the planarized upper surface of the lower metal wire 108 and the liner 106.

In an embodiment, the metal cap 112 is formed from a conductive material layer which is blanket deposited on top of the structure 100, and directly on a top surface of the ILD 110, the liner 106, the lower metal wire 108 and the ILD 104. The conductive material layer may include materials such as, for example tantalum (Ta), ruthenium (Ru), titanium (Ti), tungsten (W). The conductive material can be formed by for example, chemical vapor deposition (CVD), physical vapor deposition (PVD), and atomic layer deposition (ALD) or a combination thereof. The metal cap 112 is formed by damascene, or patterned from the conductive material layer, using known patterning and etching techniques. Damascene is the method of BEOL interconnect formation. A dielectric is deposited, patterned, and the resulting feature is metallized. Any metal overburden is removed by planarization.

A planarization process, such as, for example, chemical mechanical polishing (CMP), may be done to remove excess material from a top surface of the structure 100 such that upper horizontal surfaces of the metal cap 112 and the ILD 110 are coplanar.

In an embodiment, the bottom electrode 116 is formed from a conductive material layer which is blanket deposited on top of the structure 100, and directly on a top surface of the metal cap 112 and the ILD 110. The conductive material layer may include materials such as, for example, tantalum nitride (TaN), tantalum (Ta), titanium (Ti), titanium nitride (TiN). The conductive material layer may be deposited using typical deposition techniques, for example, physical vapor deposition, atomic layer deposition, molecular layer deposition, and chemical vapor deposition. A planarization process, such as, for example, chemical mechanical polishing (CMP), may be done to remove excess material from a top surface of the structure 100 such that an upper horizontal surface of the bottom electrode 116 is coplanar.

In an embodiment, the bottom electrode 116 may have a thickness ranging from about 10 nm to about 100 nm, although a thickness less than 10 nm and greater than 100 nm may be acceptable.

Figure 2:
FIG. 2 illustrates a cross-sectional view of the multi-state memory cell and illustrates formation of a bottom electrode, according to an exemplary embodiment.
Figure 2:
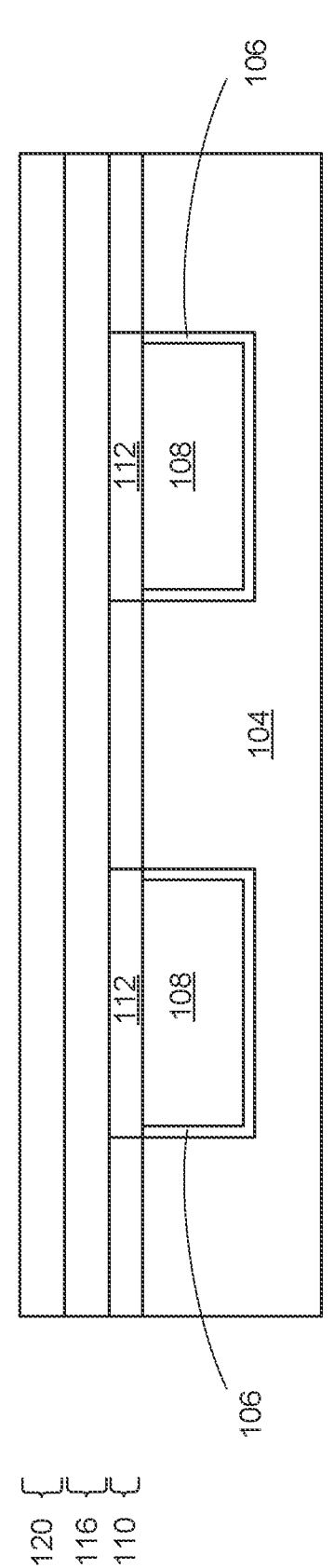

Referring now to FIG. 2, a cross-sectional view of the structure 100 is shown, according to an embodiment. A reference layer 120 may be formed.

The reference layer 120 may be formed conformally on the structure 100. The reference layer 120 may cover an upper horizontal surface of the bottom electrode 116.

Figure 3:
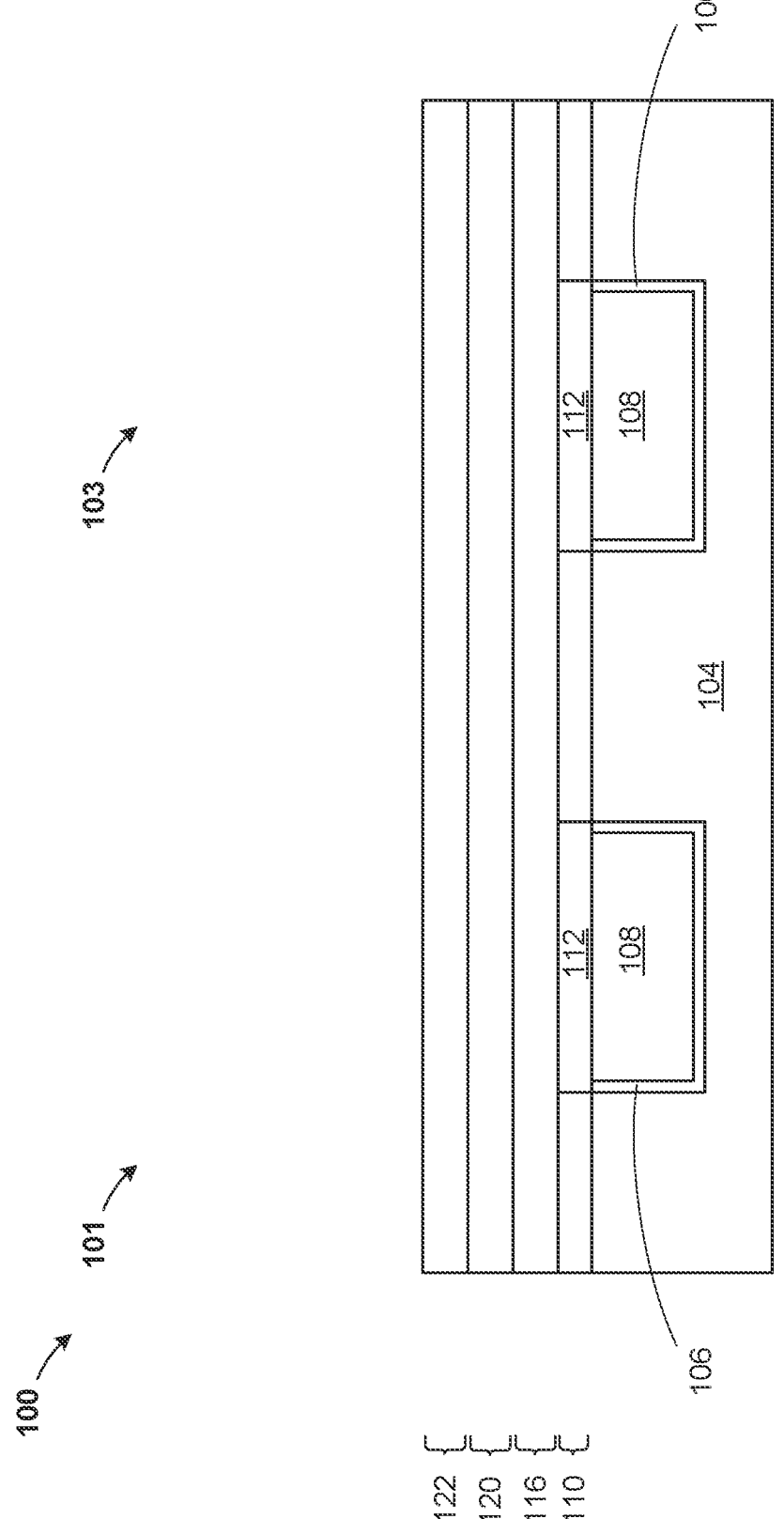
FIG. 3 illustrates a cross-sectional view of the multi-state memory cell and illustrates formation of a reference layer and a hard mask, according to an exemplary embodiment.

Referring now to FIG. 3, a cross-sectional view of the structure 100 is shown, according to an embodiment. A hard mask 122 may be formed.

The hard mask 122 may be formed on the structure 100, directly on an upper horizontal surface of the reference layer 120. The hard mask 122 may include materials such as, for example, aluminum oxide (AlOx), tetraethyl orthosilicate (TEOS). The materials chosen for the hard mask 122 may include materials which can be easily removed by wet or dry process during later processing steps.

Figure 4:
FIG. 4 illustrates a cross-sectional view of the multi-state memory cell and illustrates patterning of the reference layer and the bottom electrode, according to an exemplary embodiment.
Figure 4:
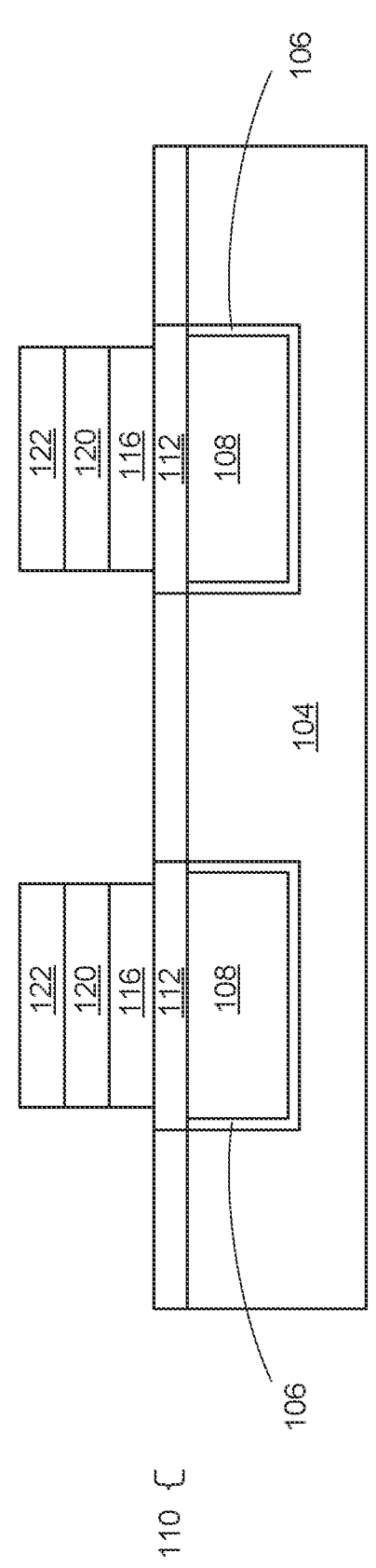

Referring now to FIG. 4, a cross-sectional view of the structure 100 is shown, according to an embodiment. Portions of the hard mask 122, the reference layer 120 and the bottom electrode 116 may be removed.

The hard mask 122 may be patterned to separate the cells 101, 103. Vertically aligned portions of the hard mask 122, the reference layer 120 and the bottom electrode 116 are selectively removed using an anisotropic etching technique, such as, for example, reactive ion etching. Remaining portions of the hard mask 122, the reference layer 120 and the bottom electrode 116 are vertical aligned above the metal cap 112 and the lower metal wire 108, in each of the cells 101, 103.

Figure 5:
FIG. 5 illustrates a cross-sectional view of the multi-state memory cell and illustrates formation of a spacer, according to an exemplary embodiment.
Figure 5:
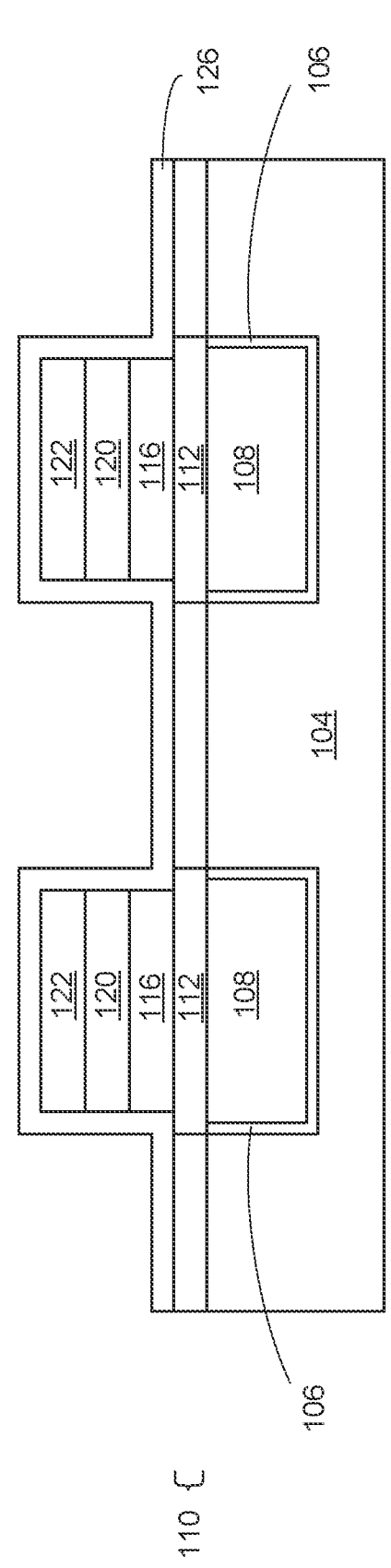

Referring now to FIG. 5, a cross-sectional view of the structure 100 is shown, according to an embodiment. A spacer 126 may be formed.

The spacer 126 may be conformally formed on the structure 100, on an upper horizontal surface of the ILD 110, on an upper horizontal surface and vertical side surfaces of the hard mask 122, and on vertical side surfaces of the reference layer 120 and the electrode 116. The spacer 126 may include materials such as, for example, any dielectric material such as silicon nitride (SiN) and silicon nitride carbon (SiNC) and may include a single layer or may include multiple layers of dielectric material. The spacer 126 may be deposited using typical deposition techniques, for example, physical vapor deposition, atomic layer deposition, molecular layer deposition, and chemical vapor deposition. The spacer 126 may have a thickness between 3 nm and 30 nm, although thickness greater than 30 nm or less than 3 nm are acceptable.

The spacer 126 helps to protect the reference layer from being damaged or oxidized during subsequent processing of the structure 100.

Figure 6:
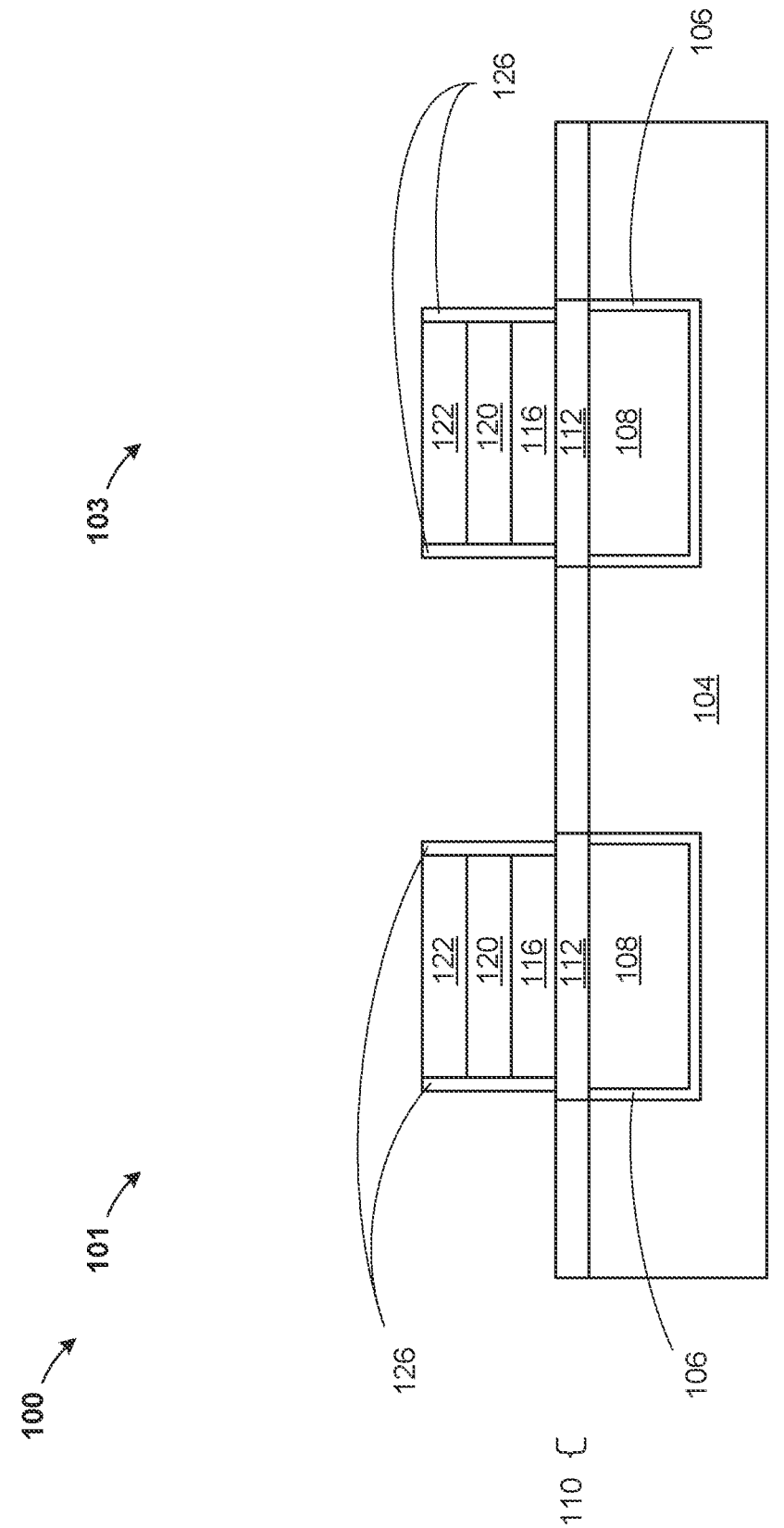
FIG. 6 illustrates a cross-sectional view of the multi-state memory cell and illustrates removal of portions of the spacer, according to an exemplary embodiment.

Referring now to FIG. 6, a cross-sectional view of the structure 100 is shown, according to an embodiment. Portions of the spacer 126 may be removed.

The portions of the spacer 126 may be selectively removed from horizontal surfaces using an anisotropic etching technique, such as, for example, reactive ion etching. The remaining portions of the spacer 126 may remain vertically aligned directly adjacent to the hard mask 122, the reference layer 120 and the bottom electrode 116, in both the cells 101, 103. The spacer 126 may be removed from upper horizontal surfaces of the hard mask 122 and the ILD 110.

Figure 7:
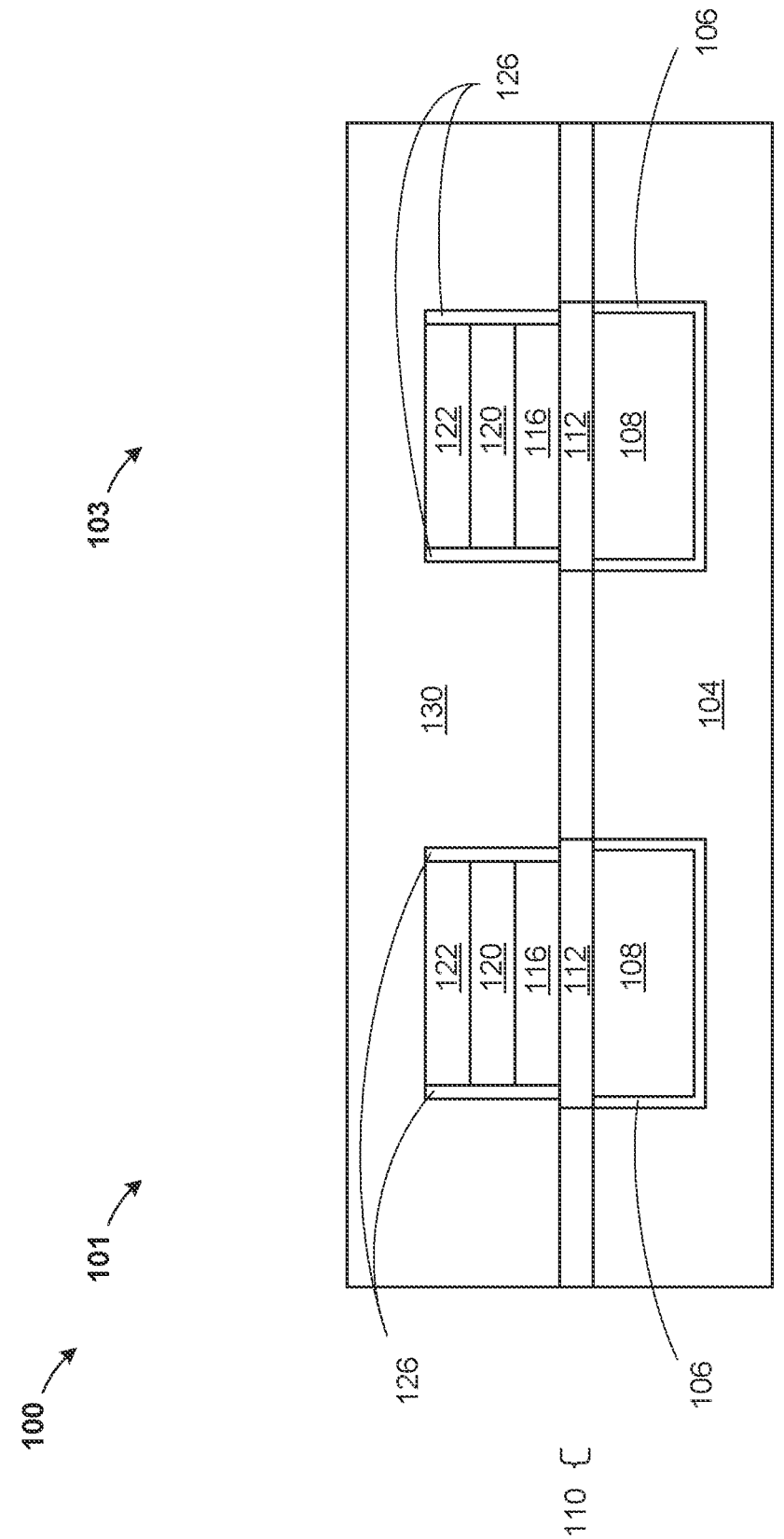
FIG. 7 illustrates a cross-sectional view of the multi-state memory cell and illustrates formation of an inter-layer dielectric, according to an exemplary embodiment.

Referring now to FIG. 7, a cross-sectional view of the structure 100 is shown, according to an embodiment. An inter-layer dielectric (hereinafter "ILD") 130 may be formed.

The ILD 130 may be formed as described for the ILD 104, conformally on the structure 100, covering upper horizontal surfaces of the spacer 126, the hard mask 122 and the ILD 110 and vertical side surfaces of the hard mask 122, the reference layer 120 and the bottom electrode 116. The ILD 130 is unlikely to contain voids as the ILD 130 is blanket deposited on the structure 100 and fills openings between adjacent hard mask 122, reference layer 120 and bottom electrode 116, between cells 101, 103. This is less likely to contain voids than forming an inter-layer dielectric surrounding additional layers of the cell 101, 103.

Figure 8:
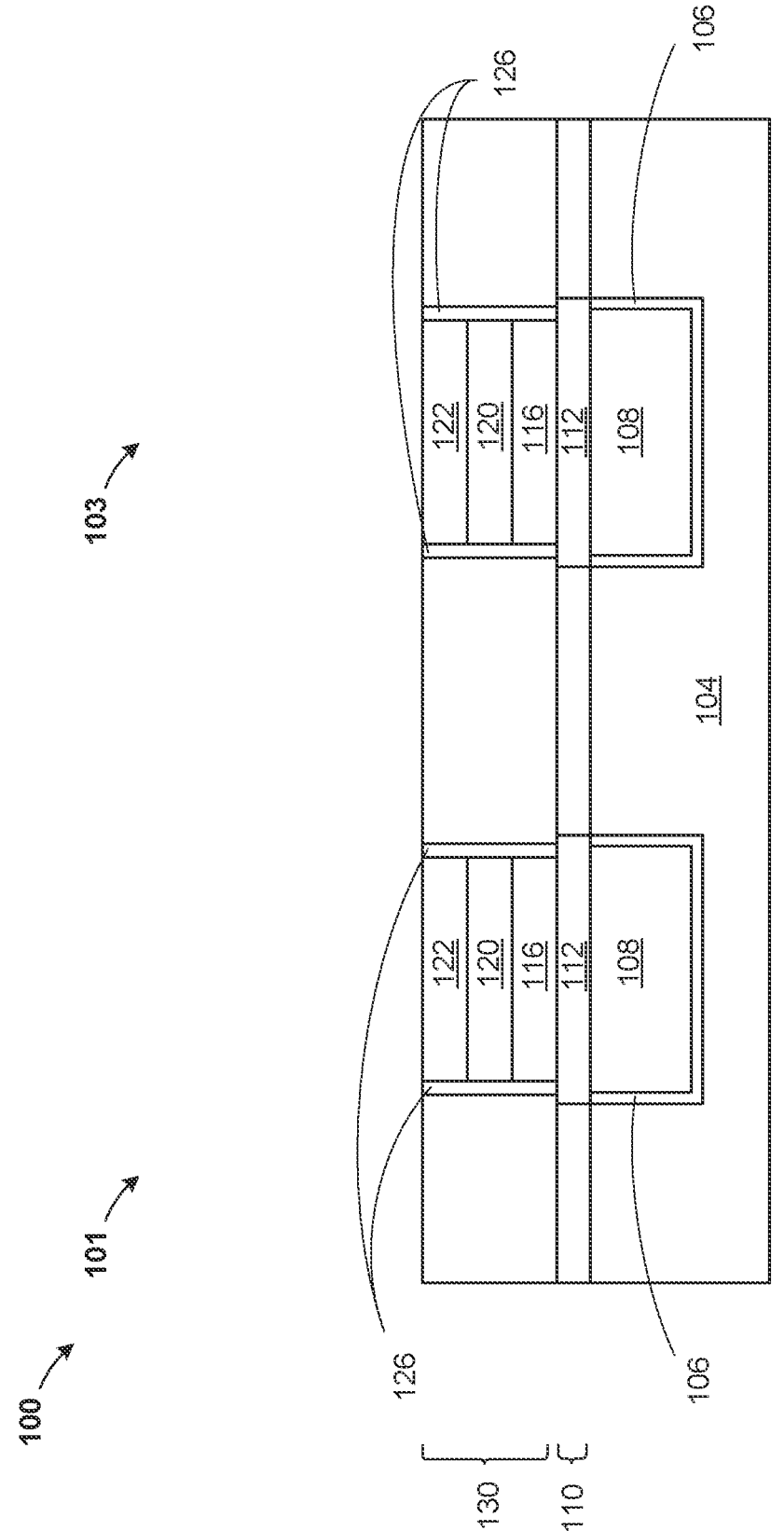
FIG. 8 illustrates a cross-sectional view of the multi-state memory cell and illustrates removal of portions of the inter-layer dielectric, according to an exemplary embodiment.

Referring now to FIG. 8, a cross-sectional view of the structure 100 is shown, according to an embodiment. Portions of the ILD 130, the spacer 126 and the hard mask 122 are removed.

A planarization process, such as, for example, a low-k chemical mechanical polishing (CMP), may be done to remove excess material from a top surface of the structure 100 such that upper horizontal surfaces of the ILD 130, the hard mask 122 and the spacer 126 are coplanar.

Figure 9:
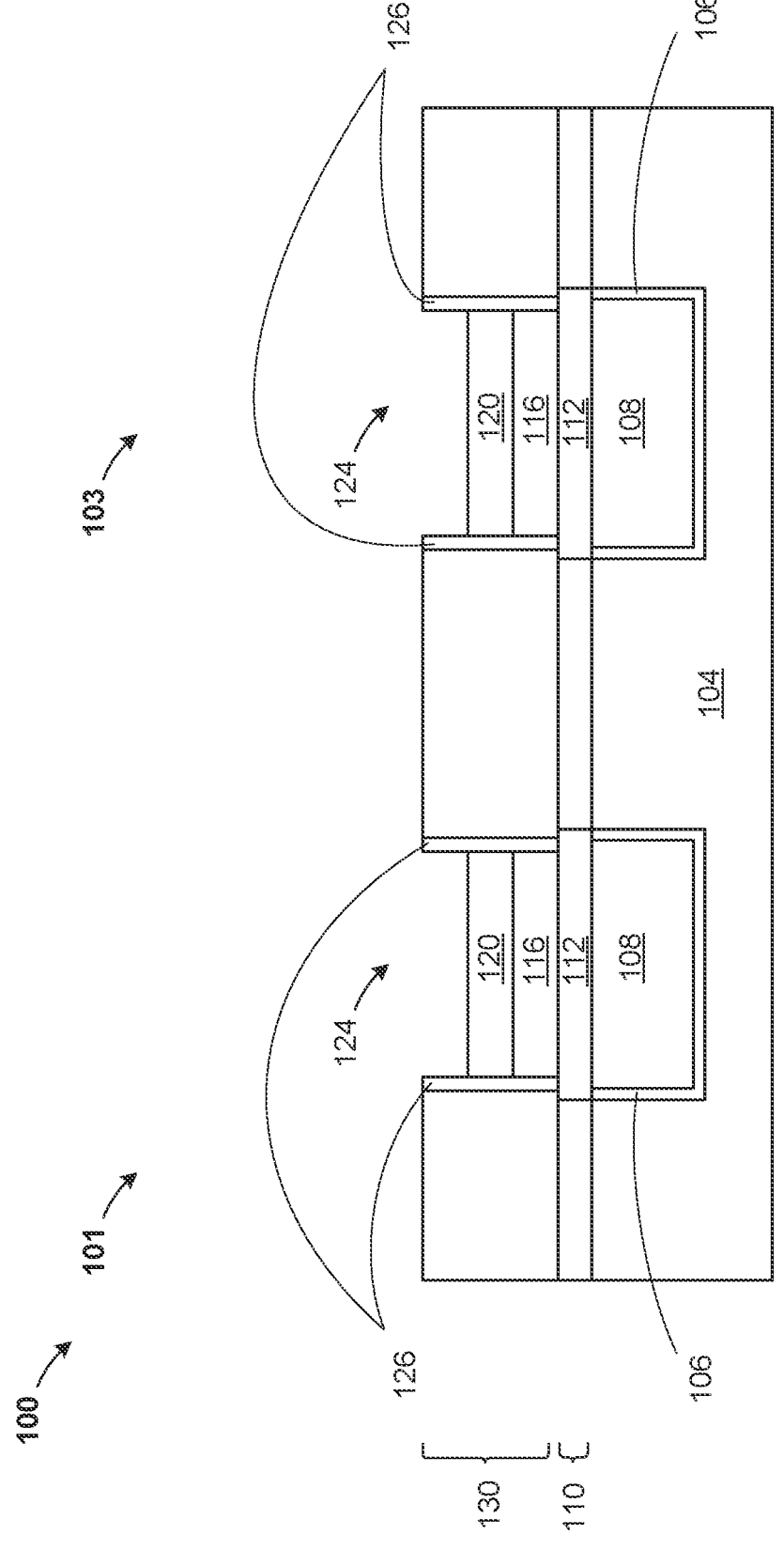
FIG. 9 illustrates a cross-sectional view of the multi-state memory cell and illustrates removal of the hard mask, according to an exemplary embodiment.

Referring now to FIG. 9, a cross-sectional view of the structure 100 is shown, according to an embodiment. The hard mask 122 is removed.

The hard mask 122 may be removed using known wet or dry etch processes, forming an opening 124 in the cell 101, 103. In an embodiment, a hard mask 122 with a material including AlOx may be removed by diluted hydrogen fluoride (dHF) etch. In an alternate embodiment of a hard mask with a material of TEOS or other material, alternate materials may be used to remove the hard mask 122, including dry etch.

The opening 124 may have a lower horizontal surface which is an upper horizontal surface of the reference layer 120. The opening 124 may have a vertical side surface of the spacer 126.

Figure 10:
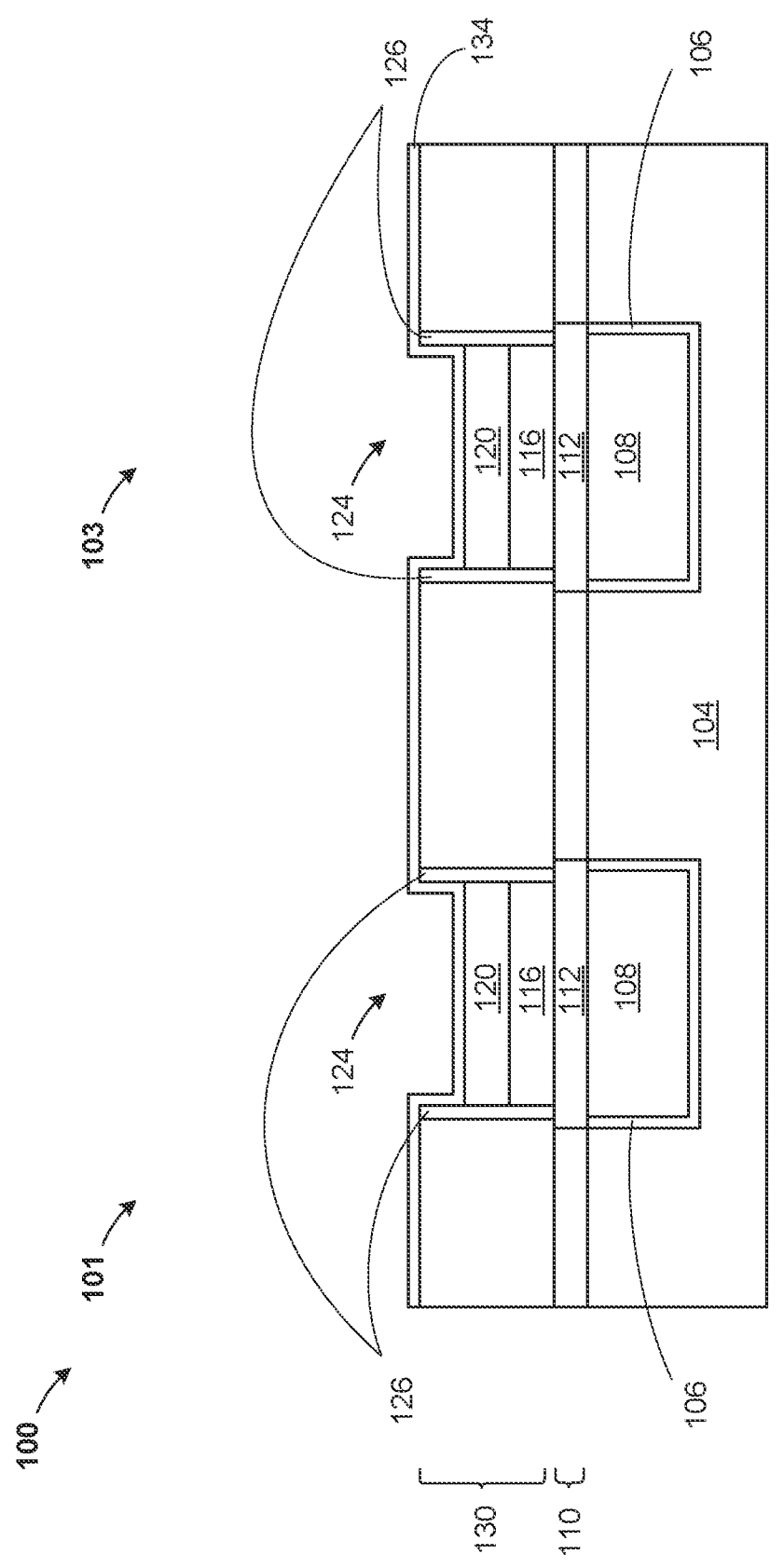
FIG. 10 illustrates a cross-sectional view of the multi-state memory cell and illustrates formation of a tunneling barrier, according to an exemplary embodiment.

Referring now to FIG. 10, a cross-sectional view of the structure 100 is shown, according to an embodiment. A tunneling barrier 134 may be formed.

The tunneling barrier 134 may be formed conformally on the structure 100, on upper horizontal surfaces of the ILD 130 and the reference layer 120, and on an upper horizontal surface and vertical side surfaces of the spacer 126.

Figure 11:
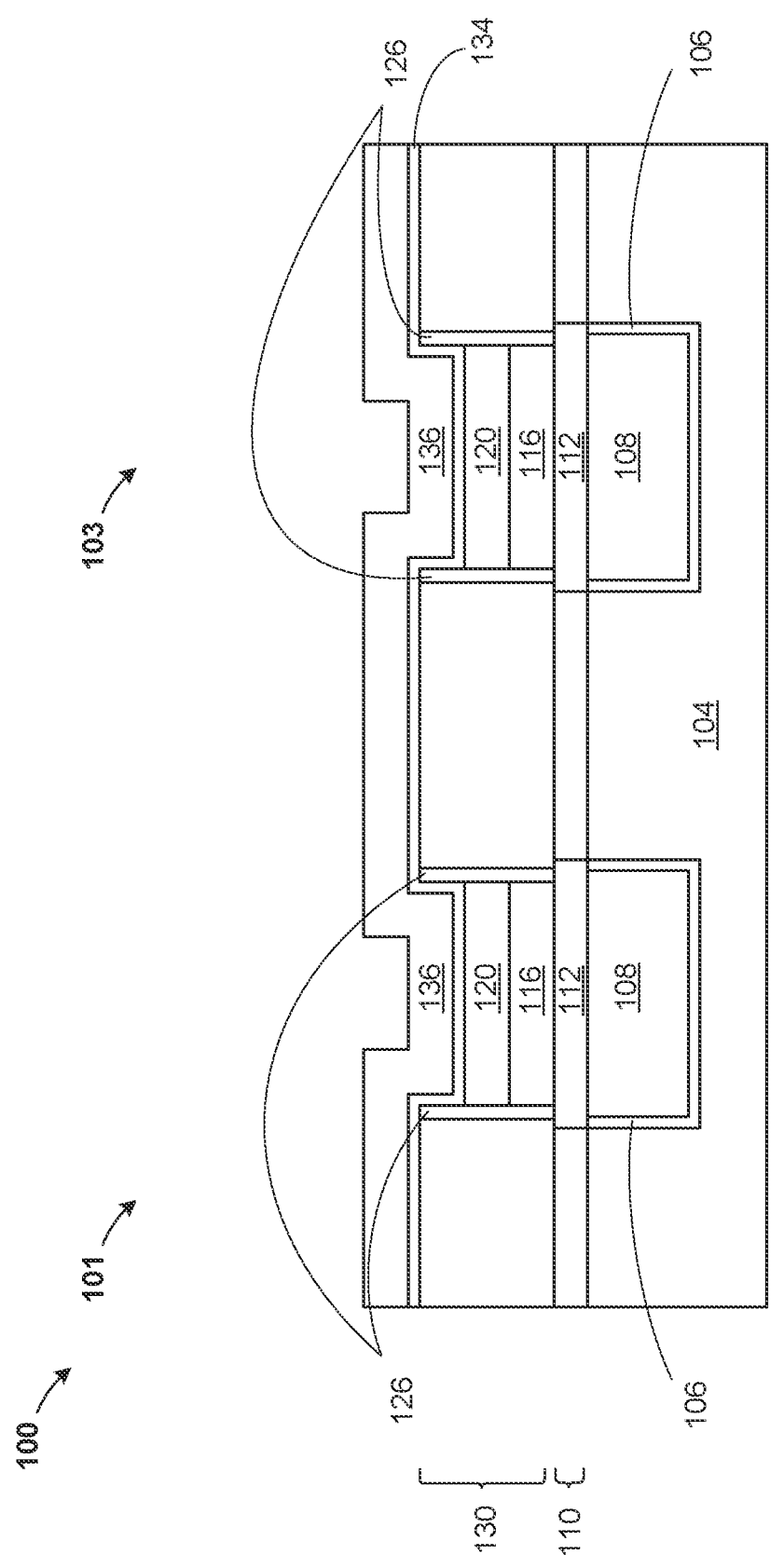
FIG. 11 illustrates a cross-sectional view of the multi-state memory cell and illustrates formation of a free layer, according to an exemplary embodiment.

Referring now to FIG. 11, a cross-sectional view of the structure 100 is shown, according to an embodiment. A free layer 136 may be formed.

The free layer 136 may be formed conformally on the structure 100, on upper horizontal surfaces of the tunneling barrier 134.

Figure 12:
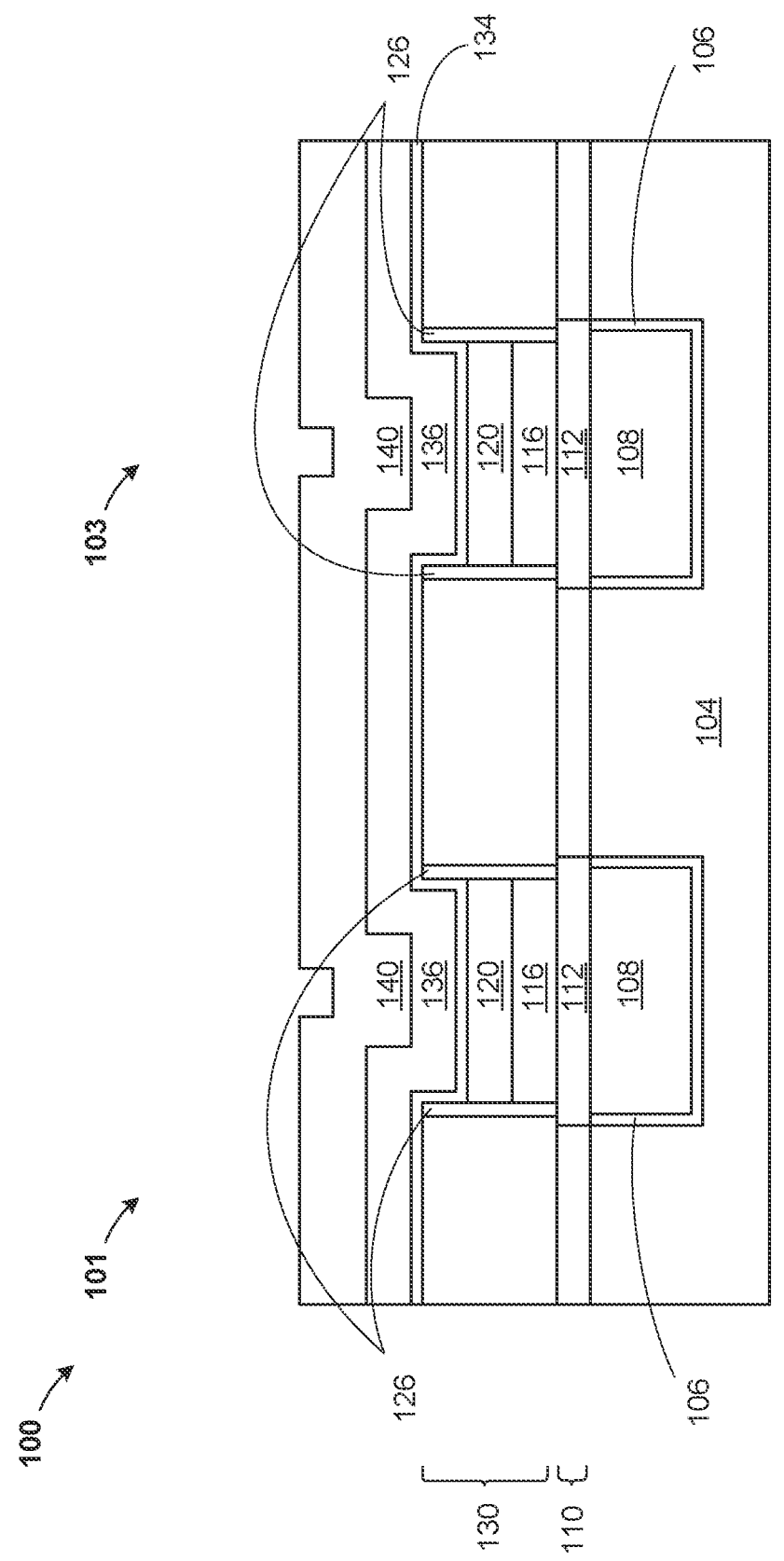
FIG. 12 illustrates a cross-sectional view of the multi-state memory cell and illustrates formation of a top electrode, according to an exemplary embodiment.

Referring now to FIG. 12, a cross-sectional view of the structure 100 is shown, according to an embodiment. A top electrode 140 may be formed.

The top electrode 140 is formed from a conductive material layer which is blanket deposited on top of the structure 100, and directly on a top surface of the free layer 136. The conductive material layer may include materials such as, for example, tantalum nitride (TaN), tantalum (Ta), titanium (Ti), titanium nitride (TiN). The conductive material layer may be deposited using typical deposition techniques, for example, physical vapor deposition, atomic layer deposition, molecular layer deposition, and chemical vapor deposition.

Figure 13:
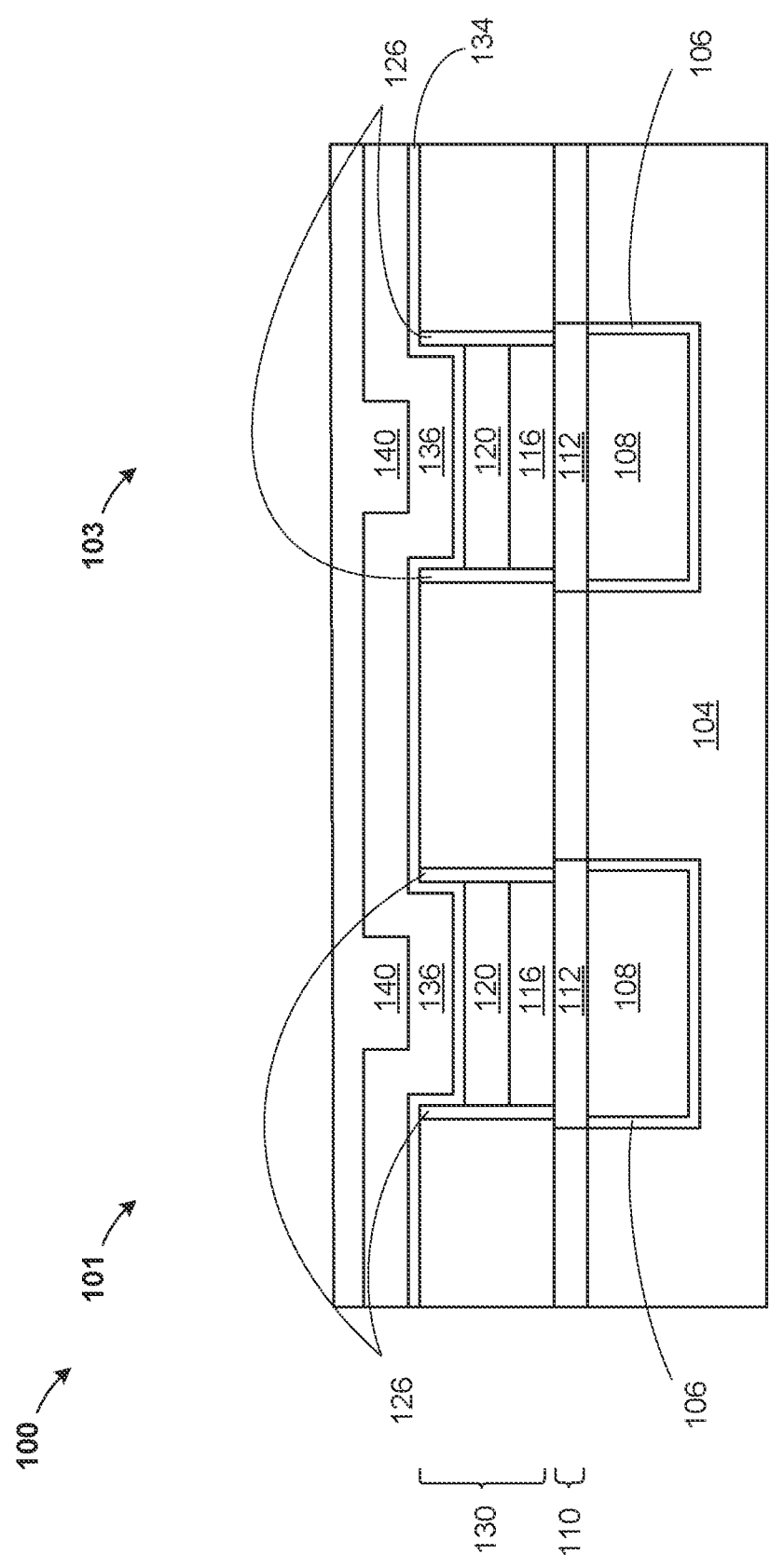
FIG. 13 illustrates a cross-sectional view of the multi-state memory cell and planarization of the top electrode, according to an exemplary embodiment.

Referring now to FIG. 13, a cross-sectional view of the structure 100 is shown, according to an embodiment. Portions of the top electrode 140 may be removed.

A planarization process, such as, for example, chemical mechanical polishing (CMP), may be done to remove excess material from a top surface of the structure 100 such that upper horizontal surfaces of the top electrode 140 is coplanar.

Figure 14:
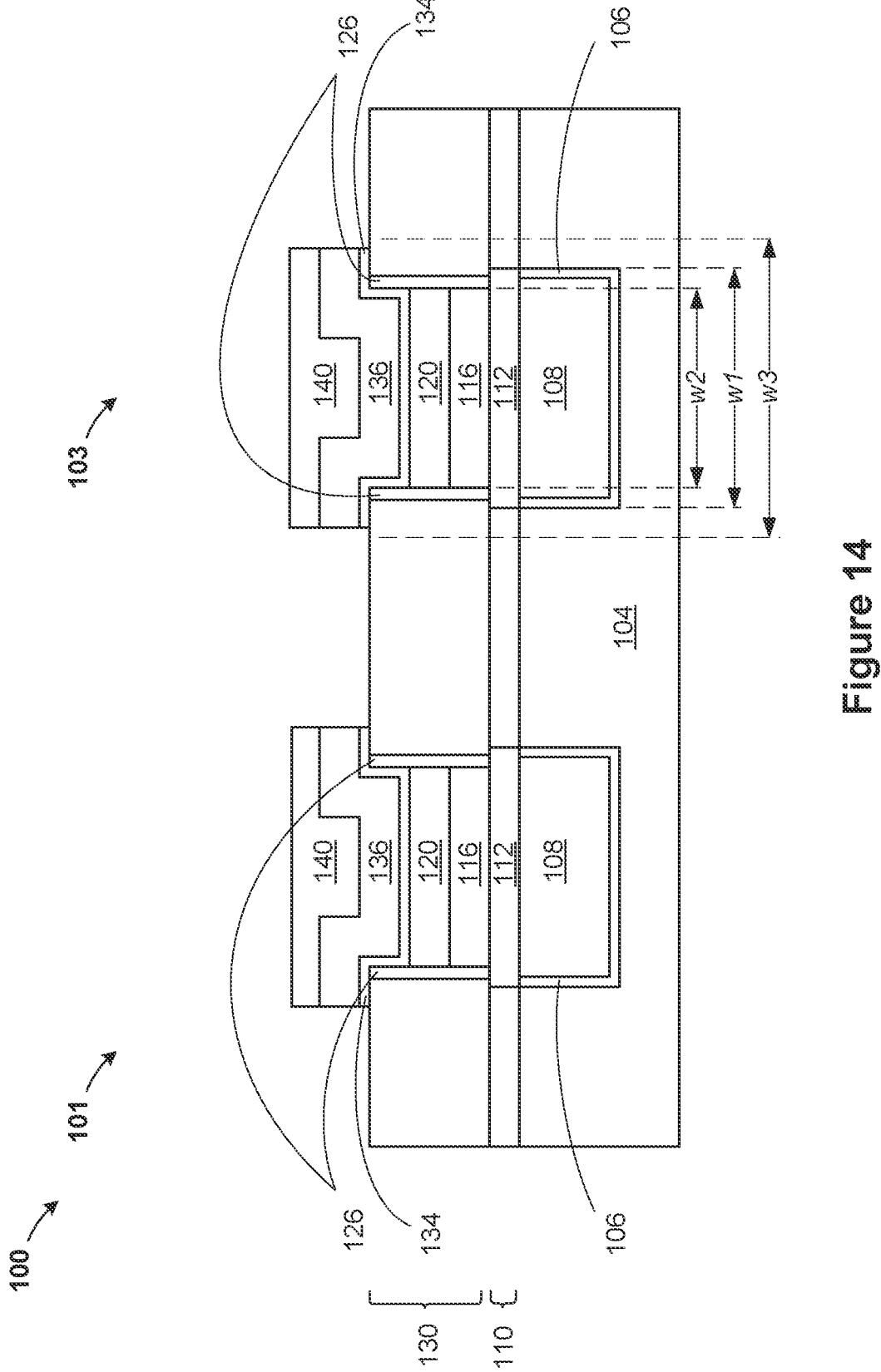
FIG. 14 illustrates a cross-sectional view of the multi-state memory cell and illustrates patterning of the top electrode, the free layer and the tunneling barrier, according to an exemplary embodiment.

Referring now to FIG. 14, a cross-sectional view of the structure 100 is shown, according to an embodiment. Portions of the top electrode 140, the free layer 136 and the tunneling barrier 134 may be removed.

The portions of the top electrode 140, the free layer 136 and the tunneling barrier 134 may be selectively removed using an anisotropic etching technique, such as, for example, ion beam etch (IBE). The remaining portions of the top electrode 140, the free layer 136 and the tunneling barrier 134 may remain vertically aligned directly above the reference layer 120, the bottom electrode 116, the metal cap 112 and the lower metal wire 108, in the cells 101, 103. An upper horizontal surface of the ILD 130 may be exposed between adjacent cells 101, 103. In an embodiment, the top electrode 140 may be patterned and the patterned top electrode 140 may be used as a hard mask for patterning the free layer 136 and the tunneling barrier 134.

The lower metal wire 108 may have a width, w1. The bottom electrode 116 and the reference layer 120 may each have a width, w2. In an embodiment, w1 may be the same as w2. The tunneling barrier 134, the free layer 136 and the top electrode 140 may each have a width, w3. The width, w3, is greater than w1. The width, w3, is greater than w2. The profile of the MTJ stack is a hammerhead shape, with the width, w3, of the tunneling barrier 134, the free layer 136 and the top electrode, greater than the width, w2, of the bottom electrode 116 and the reference layer 120, and w3 is also greater than the width, w1, of the lower metal wire 108.

Removing the portions of the top electrode 140, the free layer 136 and the tunneling barrier 134 will not cause metal re-sputtering onto the reference layer 120 and the bottom electrode 116 due to the hammerhead shape of the MTJ stack. The ILD 130, the tunneling barrier 134, having w3>w2 and the spacer 126 each help to protect vertical sidewalls of the reference layer 120 and the bottom electrode 116 from metal re-sputtering.

Figure 15:
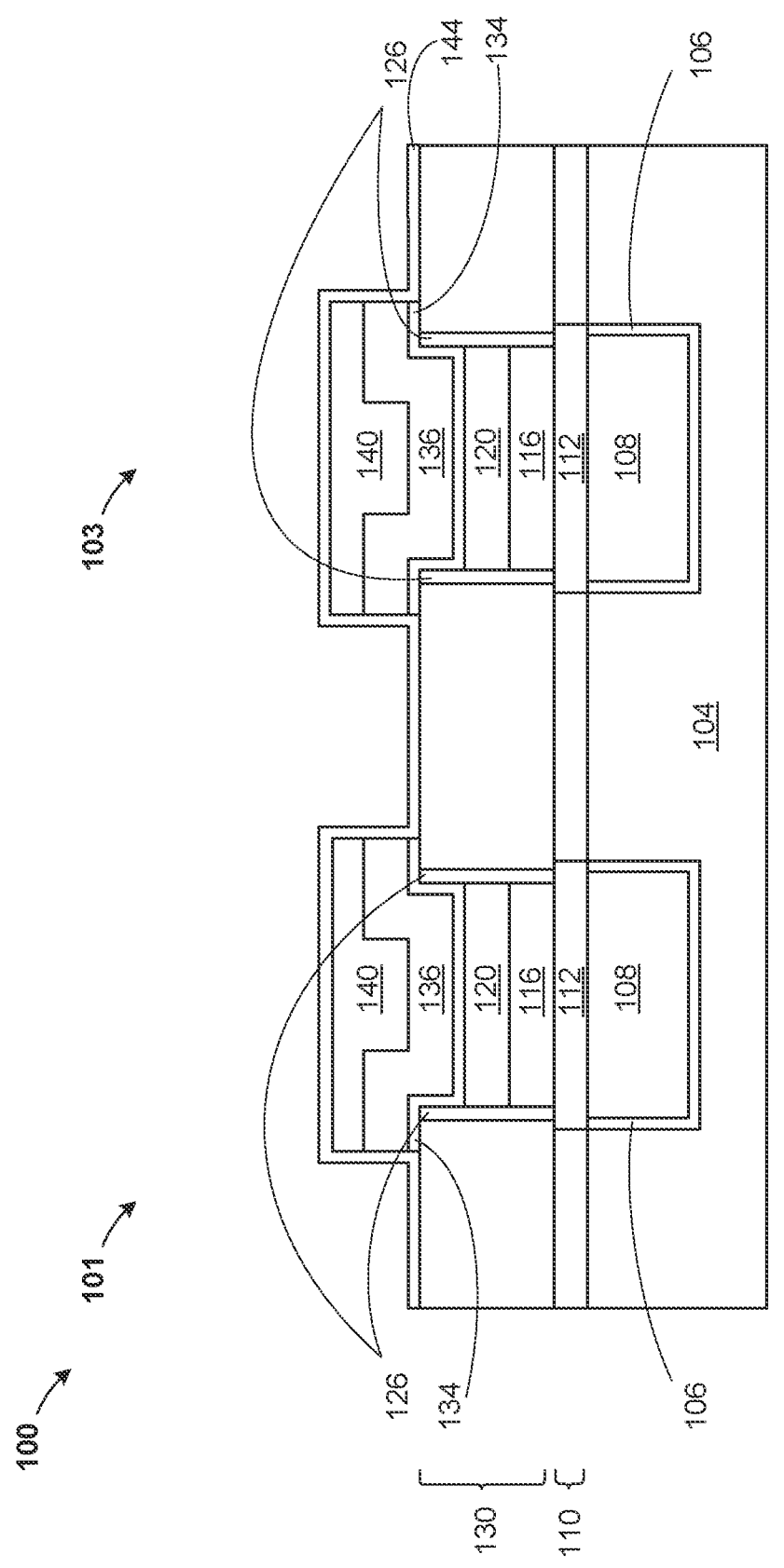
FIG. 15 illustrates a cross-sectional view of the multi-state memory cell and illustrates formation of a second spacer, according to an exemplary embodiment.

Referring now to FIG. 15, a cross-sectional view of the structure 100 is shown, according to an embodiment. A spacer 144 may be formed.

The spacer 144 may be formed conformally on the structure 100 as described for the spacer 126. The spacer 144 may be on an upper horizontal surface of the ILD 130, on vertical side surfaces of the tunneling barrier 134 and the free layer 136. The spacer 144 may be on an upper horizontal surface and vertical side surface of the top electrode 140.

Figure 16:
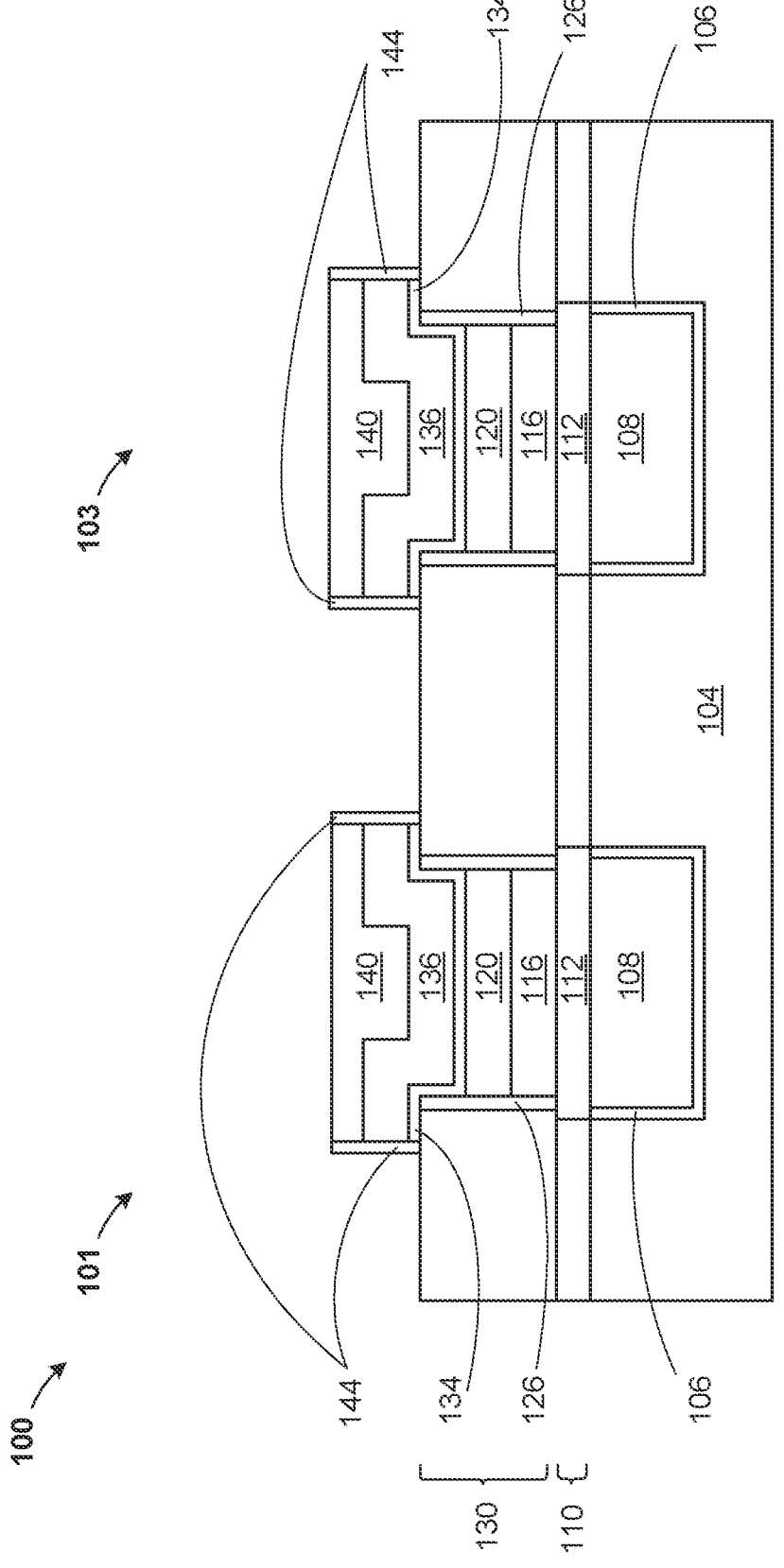
FIG. 16 illustrates a cross-sectional view of the multi-state memory cell and illustrates removal of portions of the second spacer, according to an exemplary embodiment.

Referring now to FIG. 16, a cross-sectional view of the structure 100 is shown, according to an embodiment. Portions of the spacer 144 may be removed.

The portions of the spacer 144 may be selectively removed from horizontal surfaces using an anisotropic etching technique, such as, for example, reactive ion etching. The spacer 144 may be removed from horizontal upper surfaces of the top electrode 140 and the ILD 130. The spacer 144 may remain on vertical side surfaces of the tunneling barrier 134, the free layer 136 and the top electrode 140.

The spacer 144 may help to protect the tunneling barrier 134, the free layer 136 and the top electrode 140 from being damaged or oxidized during subsequent ILD materials deposition.

Figure 17:
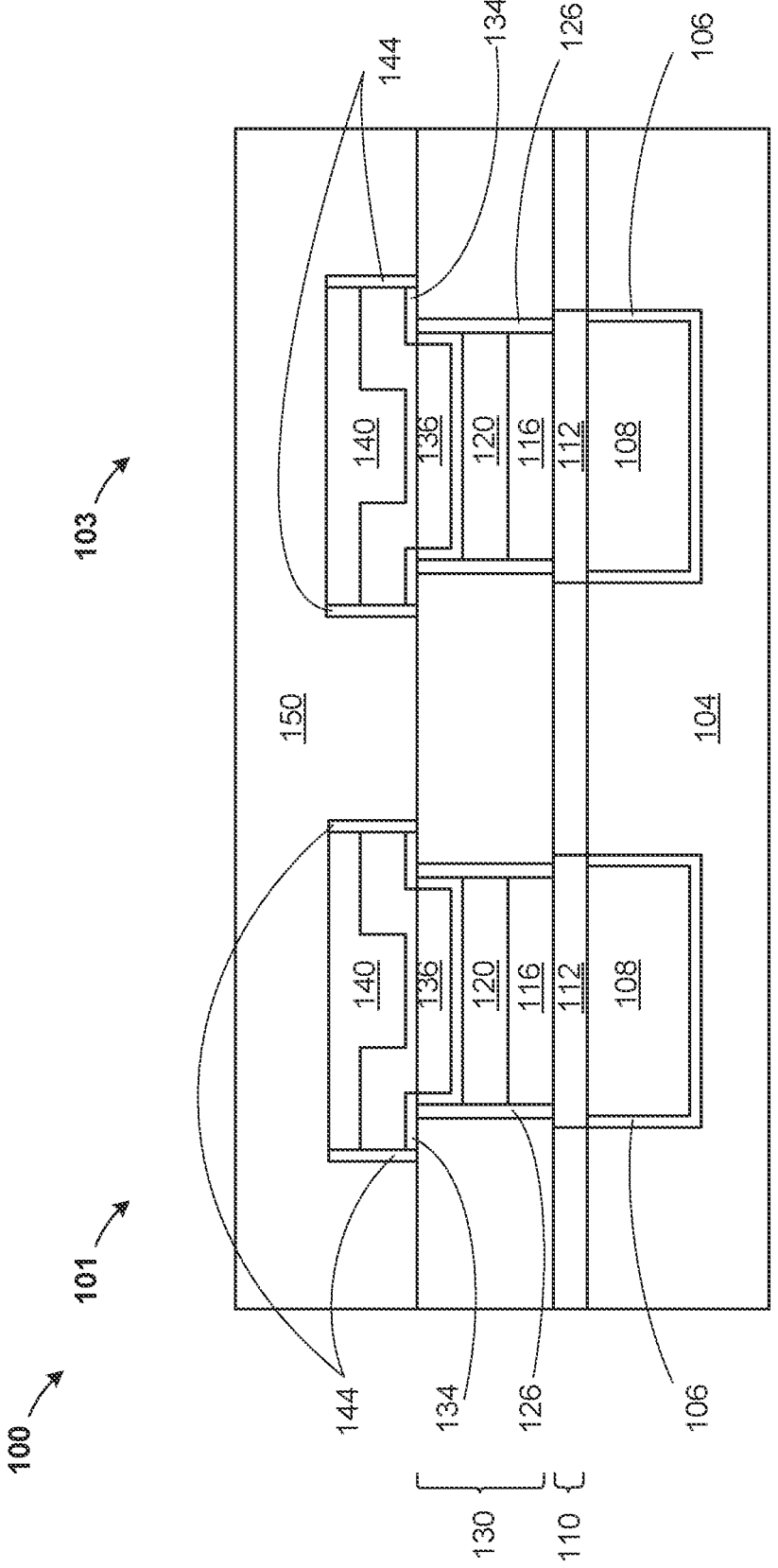
FIG. 17 illustrates a cross-sectional view of the multi-state memory cell and illustrates formation of a second inter-layer dielectric, according to an exemplary embodiment.

Referring now to FIG. 17, a cross-sectional view of the structure 100 is shown, according to an embodiment. An inter-layer dielectric (hereinafter "ILD") 150 may be formed.

The ILD 150 may be formed as described for the ILD 104. The ILD 150 may be formed conformably on the structure 100. The ILD 150 may cover upper horizontal surfaces of the top electrode 140 and the ILD 130. The ILD 150 may cover vertical side surfaces of the spacer 144.

The ILD 150 may include a low-k to reduce an overall capacitance of the MTJ device. The ILD 150 may be deposited utilizing a conventional deposition process such as, for example, flowable CVD (hereinafter "fCVD"), which can fill small gaps such as area between cell 101 and 103.

Figure 18:
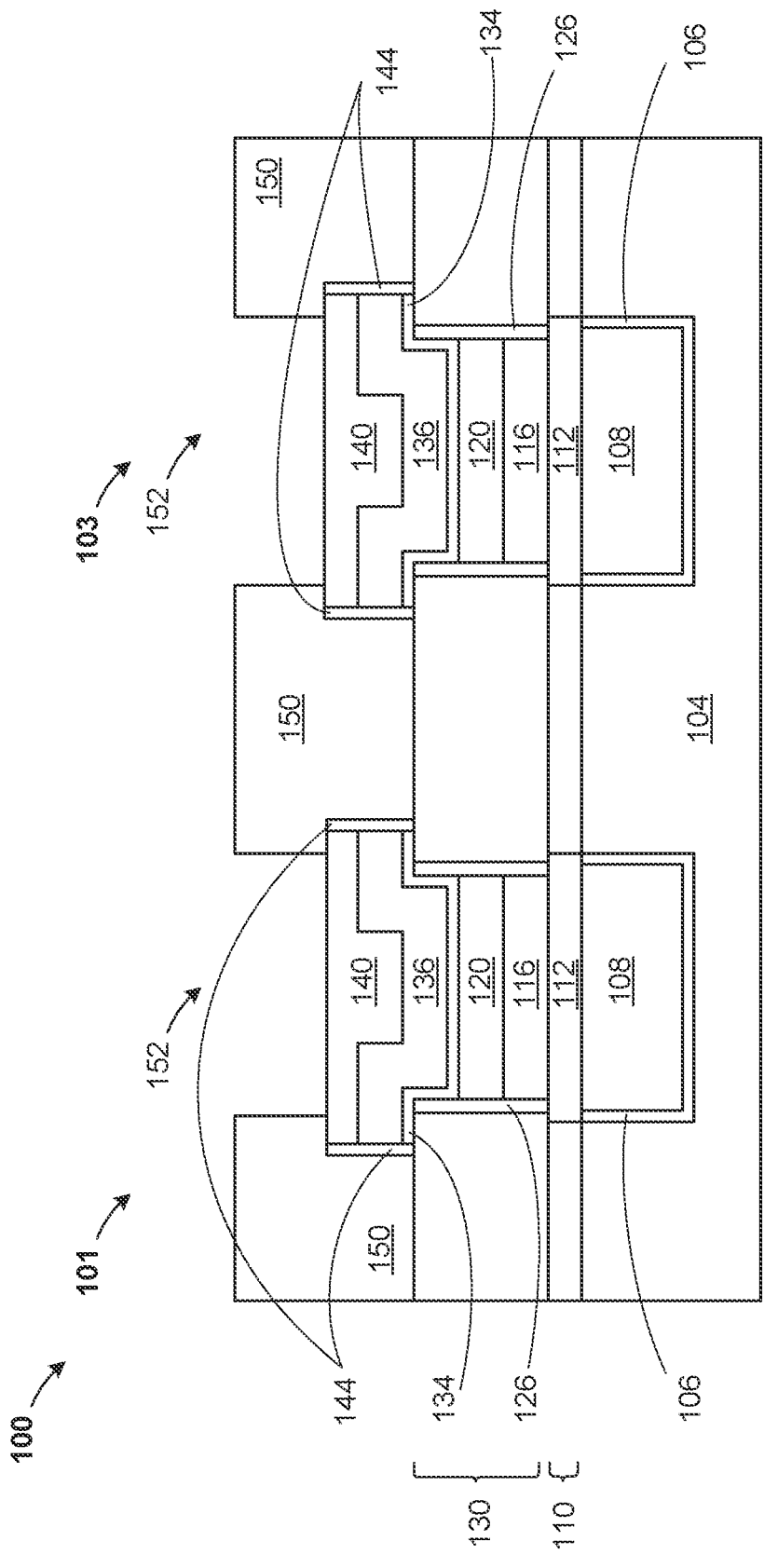
FIG. 18 illustrates a cross-sectional view of the multi-state memory cell and illustrates removal of portions of the second inter-layer dielectric, according to an exemplary embodiment.

Referring now to FIG. 18, a cross-sectional view of the structure 100 is shown, according to an embodiment. An opening 152 may be formed in the ILD 150.

The openings may be formed by known techniques. The opening 152 may be formed in each cell 101, 103. The opening 152 may be vertically aligned directly above the top electrode 140, the free layer 136, the tunneling barrier 134, the reference layer 120, the bottom electrode 116, the metal cap 112 and the lower metal wire 108, in the cells 101, 103.

Figure 19:
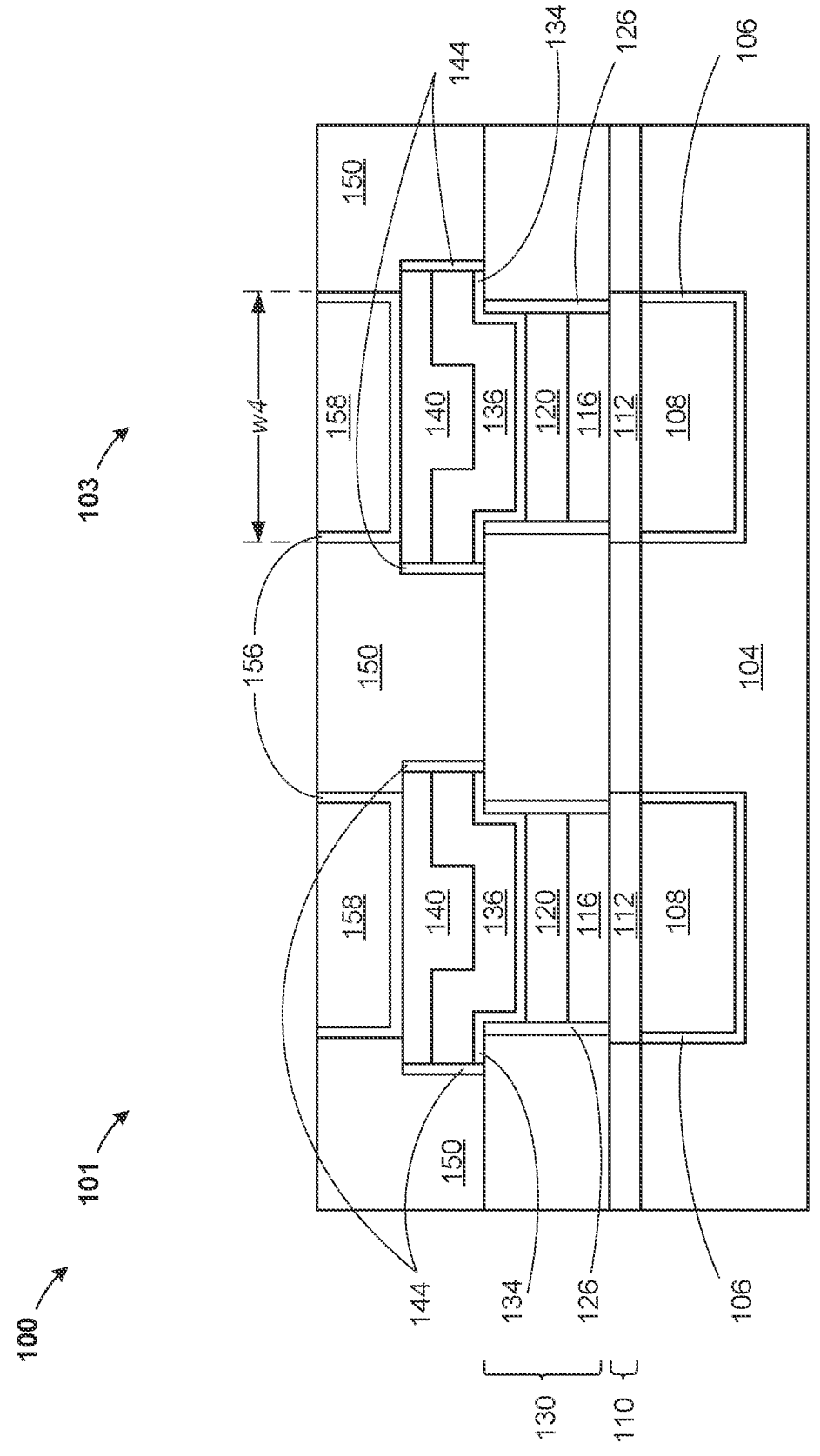
FIG. 19 illustrates a cross-sectional view of the multi-state memory cell and illustrates formation of an upper metal wire, according to an exemplary embodiment.

Referring now to FIG. 19, a cross-sectional view of the structure 100 is shown, according to an embodiment. A liner 156 and an upper metal wire 158 may be formed.

The liner 156 and the upper metal wire 158 may be formed in the opening 152. The liner 156 and the upper metal wire 158 may be formed as described for the liner 106 and the lower metal wire 108. The liner 156 separates the conductive interconnect material of the upper metal wire 158 from the ILD 150. The liner 156 surround a lower horizontal surface and a vertical side surface of the upper metal wire 158. There may be any number of openings in the ILD 150, each lined with the liner 156 and the upper metal wire 158, on the structure 100.

The liner 156 and the upper metal wire may be vertically aligned directly above the top electrode 140, the free layer 136, the tunneling barrier 134, the reference layer 120, the bottom electrode 116, the metal cap 112 and the lower metal wire 108, in the cells 101, 103.

The top electrode may have a width, w4, which may be similar to a width, w1, of the bottom electrode.

A planarization process, such as, for example, chemical mechanical polishing (CMP), may be done to remove excess material from a top surface of the structure 100 such that upper horizontal surfaces of the upper metal wire 158, the liner 156 and the ILD 150 are coplanar.

The structure 100 has vertically aligned portions of the MTJ stack, including the bottom electrode 116, the reference layer 120, the tunneling barrier 134, the free layer 136 and the top electrode 140, with a width of the tunneling barrier 134, the free layer 136 and the top electrode 140 greater than a width of the bottom electrode 116 and the reference layer 120. The MTJ stack is vertically aligned between the lower metal wire 108 and the upper metal wire 158.

The tunneling barrier 134 may have a 'stepped' lower horizontal surface, which includes a first lower horizontal surface directly on an upper horizontal surface of the reference layer 120, and a vertical side surface along a vertical side surface of the free layer 136, and a second lower horizontal surface below the free layer 136, extending out wider than the first lower horizontal surface. The free layer 136 may also have a 'stepped' lower horizontal surface, which includes a third lower horizontal surface directly on an upper horizontal surface of the tunneling barrier 134, and a vertical side surface along a vertical side surface of the tunneling barrier 134, and a fourth lower horizontal surface below the top electrode 140, extending out wider than the third lower horizontal surface. The top electrode 140 may have a greater height in a center portion of the MTJ structure and a lower height at an outer portion of the MTJ structure.

An MRAM pillar with a hammerhead profile helps to suppress metal re-sputtering from the bottom electrode 116 and the reference layer 120 during the tunneling barrier 134 and free layer 136 formation. This helps to extend scalability of MRAM device memory elements due to reduced sputtering between MRAM pillars and improved embedded MRAM performance due to reduced top contact shorts.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A semiconductor device comprising:
   a magnetic tunnel junction (MTJ) stack comprising vertically aligned layers of a top electrode, a free layer, a tunneling barrier, a reference layer and a bottom electrode, wherein the bottom electrode and the reference layer each comprise a first width, wherein a cross section of the MTJ stack comprises a hammerhead profile; and
   wherein the top electrode, the free layer and the tunneling barrier, each comprise a second width, wherein the second width is greater than the first width.

2. The semiconductor device according to claim 1, further comprising:
   a first liner along vertical side surfaces of the bottom electrode, the reference layer and the tunneling barrier, wherein the first liner is not along vertical side surfaces of the free layer nor the top electrode.

3. The semiconductor device according to claim 2, further-comprising:
   a second liner along vertical side surfaces of the tunneling barrier, the free layer and the top electrode, wherein the second liner is not in contact with the first liner.

4. The semiconductor device according to claim 1, further wherein the tunneling barrier and the free layer each comprise a first horizontal lower surface and a second horizontal lower surface, wherein the first horizontal lower surface is not adjacent to the second horizontal lower surface.

5. A semiconductor device comprising:
   a magnetic tunnel junction (MTJ) stack, wherein
   a cross section of the MTJ stack comprises a hammerhead profile, wherein
   the MTJ stack comprises vertically aligned layers of a top electrode, a free layer, a tunneling barrier, a reference layer and a bottom electrode, wherein
   the bottom electrode and the reference layer each comprise a first width; and
   the top electrode, the free layer and the tunneling barrier, each comprise a second width, wherein the second width is greater than the first width.

6. The semiconductor device according to claim 5, further comprising:
   a first liner along vertical side surfaces of the bottom electrode, the reference layer and the tunneling barrier, wherein the first liner is not along vertical side surfaces of the free layer nor the top electrode.

7. The semiconductor device according to claim 6, further comprising:
   a second liner along vertical side surfaces of the tunneling barrier, the free layer and the top electrode, wherein the second liner is not in contact with the first liner.

8. The semiconductor device according to claim 7, wherein the tunneling barrier and the free layer each comprise a first horizontal lower surface and a second horizontal lower surface, wherein the first horizontal lower surface is not adjacent to the second horizontal lower surface.

9. A method comprising:
   forming vertically aligned layers of a bottom electrode and a reference layer on the bottom electrode, of a magnetic tunnel junction (MTJ) stack in a first dielectric, wherein the bottom electrode, the reference layer and a hard mask, each comprise a first width; and
   separately forming vertically aligned layers of a tunneling barrier on the reference layer, a free layer on the tunneling barrier and a top electrode on the free layer, wherein the tunneling barrier, the free layer and the top electrode each comprise a second width, wherein the second width is greater than the first width.

10. The method according to claim 9, further comprising: forming a first liner along vertical side surfaces of the bottom electrode, the reference layer and the tunneling barrier, wherein the first liner is not along vertical side surfaces of the free layer nor the top electrode.

11. The method according to claim 10, further comprising: forming a second liner along vertical side surfaces of the tunneling barrier, the free layer and the top electrode, wherein the second liner is not in contact with the first liner.

12. The method according to claim 9, wherein the tunneling barrier and the free layer each comprise a first horizontal lower surface and a second horizontal lower surface, wherein the first horizontal lower surface is not adjacent to the second horizontal lower surface.

13. The method according to claim 9, further comprising: forming a low-k dielectric surrounding the vertically aligned layers of the bottom electrode and the reference layer.

\* \* \* \* \*